United States Patent [19]
Yee et al.

[11] Patent Number: 5,510,641
[45] Date of Patent: Apr. 23, 1996

[54] MAJORITY CARRIER POWER DIODE

[75] Inventors: Hsian-Pei Yee; Peter O. Lauritzen; Sinclair S. Yee, all of Seattle, Wash.

[73] Assignee: University of Washington, Seattle, Wash.

[21] Appl. No.: 40,920

[22] Filed: Mar. 31, 1993

Related U.S. Application Data

[63] Continuation-in-part of Ser. No. 891,581, Jun. 1, 1992, abandoned.

[51] Int. Cl.$^6$ .................................................. H01L 29/76
[52] U.S. Cl. ........................... 257/367; 257/335; 257/362
[58] Field of Search ...................................... 257/329, 335, 257/343, 367, 288, 138, 147, 260, 314, 361, 362; 307/573, 574, 575, 577, 256

[56] References Cited

U.S. PATENT DOCUMENTS 5,031,008  7/1991  Yoshida ................................. 257/343

FOREIGN PATENT DOCUMENTS

| | | | |
|---|---|---|---|
| 58-101463 | 6/1983 | Japan | 257/361 |
| 2-91974 | 3/1990 | Japan | H01L 29/784 |
| 4-74464 | 3/1992 | Japan | 257/288 |

*Primary Examiner*—Sara W. Crane
*Attorney, Agent, or Firm*—Ronald M. Anderson

[57] ABSTRACT

A power diode having substantially no reverse-recovery time and relatively high conductance. The power diode is a majority carrier semiconductor having a structure that is similar to that of a metal oxide semiconductor field effect transistor (MOSFET), in that it includes a source, a drain, a gate, and a body. In one embodiment, to increase conductance of the power diode, a linked-cell configuration that reverses the geometry of a conventional cell-type MOSFET is employed, thereby increasing the width of a conductance channel over that of a conventional MOSFET, and compensating for a relatively low level of inversion in the channel region. Negative and positive feedback circuits are used to further improve the conductance of the power diode by dynamically setting a bias voltage applied between the gate and the source to a level just below a threshold voltage. In the positive feedback circuit, the magnitude of the bias voltage is greater than the threshold voltage if the power diode is forward biased, but substantially reduced if the power diode is reverse biased, thereby minimizing its turn-on delay without risking reverse conductance. Although separate components are used for biasing the device in the disclosed embodiments, it is contemplated that these components be integrated on a common substrate with the source, drain, and gate in a commercially practiced preferred embodiment. Another embodiment employs a charge carrier region diffused into the body and at least in part underlying the gate. This region provides a variable threshold voltage along the channel and reduces the effective length of the channel to increase its conductance. A threshold voltage ranges between a higher value, $V_{TMAX}$, adjacent the source, to a lower value, $V_T$, elsewhere in the device.

40 Claims, 8 Drawing Sheets

MAJORITY CARRIER POWER DIODE

RELATED APPLICATION

This is a continuation-in-part of prior application Ser. No. 07/891,581, filed Jun. 1, 1992, abandoned, the benefit of the filing date of which is hereby claimed under 35 U.S.C. §120.

FIELD OF THE INVENTION

This invention generally pertains to a majority charge carrier semiconductor having a conduction channel and, more specifically, to a semiconductor having a source, a drain, and a gate, the device being configured as a two terminal rectifier with an anode and a cathode.

BACKGROUND OF THE INVENTION

To minimize the volume or bulk of inductors and capacitors used for temporary energy storage in power converters, it is preferable to operate the converters at high frequencies, thereby improving the ratio of power to volume. Such devices typically employ p-v-n power diodes for high voltage rectification. However, the frequency at which a converter can be operated is limited by the corresponding required switching speed of the p-v-n power diodes. The high voltage power diodes usually exhibit a significant reverse-recovery switching delay and power loss during each reverse-recovery, which increases with frequency. Power diodes also tend to inject significant electro-magnetic interference (EMI), developed during reverse-recovery switching, into the converter circuitry.

Conventional p-v-n power diodes use a lightly-doped base layer to block high voltages and therefore require carrier injection into this lightly-doped base to obtain a high ON-state conductance. Although such devices have a relatively low forward voltage drop, they are limited in switching speed by the lifetime of the injected carriers.

Ultra fast recovery (UFR) p-v-n diodes have been developed, which are more than an order of magnitude faster than the conventional p-v-n diodes. However, since switching losses due to diode reverse-recovery increase proportionally with the switching frequency in a power converter, the switching speed of a converter using UFR diodes is still limited to less than 100 KHz.

Diode reverse-recovery occurs when a diode is rapidly switched from a forward conducting to a reverse blocking state. To increase the voltage rating of diodes, a lightly-doped base region, which has very low conductance, is added at the junction. During forward conduction, minority charge carriers are injected into this base region from both N and P sides of the diode, enabling a relatively low ON-voltage to be achieved. Before the diode can block reverse voltage, these charge carriers must be removed. Removal of the minority charge carriers from a base region of the diode occurs over a reverse-recovery time. During this time interval, significant power loss is incurred due to simultaneous occurrence of a high reverse voltage and a reverse current. Reverse-recovery power loss increases with switching frequency and with the reverse-recovery time.

Currently, synchronous rectifiers comprising power metal oxide semiconductor field effect transistors (MOSFETs) are used in high voltage converters to achieve operation at frequencies above 100 KHz. The power MOSFETs in these devices are configured so that they turn on synchronously with other switches in the converter. Since MOSFETs are majority charge carrier devices with virtually no recovery time, they can be more efficient than p-v-n diodes. Their primary disadvantage arises due to the cost and complexity of providing an external control circuit for the gates of the MOSFETs so that they can be activated in synchronization with the other switches of the converter.

For power conversion at relatively low voltages (less than 100 volts), Schottky diodes are often used. Schottky diodes use a metal-semiconductor junction to provide current transport by majority charge carriers. Thus, like MOSFETs, Schottky diodes exhibit no observable reverse-recovery. However, to operate at higher voltages, a Schottky diode must be configured with a wide, lightly-doped base region, which limits the frequency response to about the level of a p-v-n diode, due to the relatively short lifetime of injected charge carriers.

A semiconductor device that operates as a diode and which starts conducting at a threshold voltage from anode to cathode of substantially zero volts is disclosed in published Japanese Patent Application No. H2-091974 (1990), which lists T. Sakai et al. as the inventors. This device, which is disclosed in three different embodiments, comprises an insulated gate type field effect transistor (FET) constructed with a channel formation region. This device has a second conductive semiconductor substrate deposited on a primary surface of a first conductive semiconductor substrate. A first drain region is provided inside a channel formation region, and in one embodiment, a groove is formed inside the drain region so as to extend into a first surface of the second semiconductor substrate; a gate-insulating film and gate electrode are then formed inside the groove. Art anode electrode electrically connects the channel formation region, the drain region, and the gate electrode. By proper selection of the impurity density in a P-type region underlying the gate insulating film and the thickness of the insulating film, a threshold voltage of the FET is set to about zero volts. If a voltage greater than the threshold is applied to the anode electrode (relative to the cathode that comprises a second surface of the first conductive semiconductor substrate), an N-channel is formed over the lower surface of the gate insulating film, and current flows through the device. This current comprises both a channel current and a body diode current. However, if the voltage on the anode is less than that of the cathode, channel and body diode current do not flow. Thus, the two terminal device achieves rectification at substantially a zero voltage threshold using a channel conduction effect. However, the device is useful only for relatively low current applications. Like most semiconductor devices, the current carrying capacity or conductance of the Sakai et al. FET is partly a function of its size; but for a given size, other more conventional and readily available devices can provide the same low forward voltage drop rectification at less cost.

Accordingly, it will be evident that a semiconductor diode device is required that exhibits minimal reverse-recovery, is operable at frequencies significantly above 100 KHz, and at a voltage substantially in excess of 100 volts, and which is capable of carrying substantial current compared to conventional rectifying devices of the same size. Such a device should have considerable, utility in power converters and in other applications in which high frequency, high power, and high voltage rectifiers are used.

SUMMARY OF THE INVENTION

In accordance with one form of the present invention, a majority carrier semiconductor diode includes an N-type substrate having a conductive contact that defines a drain. A P-type material is applied to the N-type substrate and has a conductive contact that forms a body. Also, an N-type material is applied to the P-type material comprising the body and this N-type material has a conductive contact to form a source. A gate on the diode comprises a dielectric material disposed adjacent the source and the drain, which is provided with a conductive contact. Biasing means are included to bias the gate to provide an N-channel that conducts an electrical current between the source and the drain for a negative drain-source voltage, while blocking electrical current flow between the source and the drain for a positive drain-source voltage.

The biasing means provide a gate-source voltage that is less than a threshold voltage, creating a weak inversion layer in the body. This inversion layer or N-channel does not support conduction unless the drain is more negative than the source. In one embodiment, the biasing means include negative feedback means for increasing a conductance of the N-channel. In another embodiment, the biasing means include positive feedback means for increasing the conductance of the N-channel. In the latter embodiment, the positive feedback means include means for biasing the gate-source voltage above a threshold voltage when the drain is more negative than the source, and biasing the gate-source voltage to a substantially lower voltage, if the drain is more positive than the source.

In yet another configuration of the device, the P-type material comprising the body includes a P+ region on which the N-type material comprising the source is applied. This P+ region enables a variable threshold for conductance through the N-type channel, ranging between $V_T$ and $V_{TMAX}$, and reduces the length of the N-type channel. Consequently, for a negative drain-source voltage, conductance through the N-type channel is initiated with a gate-source voltage less than the threshold voltage, $V_T$. Once conductance through the channel is initiated, a substantially increased conductance through the N-type channel can be enabled by increasing the gate-source voltage above the threshold voltage, $V_T$.

Another aspect of the invention is a P-channel version of the semiconductor diode, having elements corresponding to those of the N-channel configuration described above, but with the opposite polarity.

A still further aspect of the present invention is a biasing circuit for operating a MOSFET as a channel diode. The biasing circuit includes conductance monitoring means for sensing either an electrical current flowing through a drain and a source of the MOSFET, or a voltage across the drain and source of the MOSFET, producing a feedback signal indicative of the electrical current or the voltage. Biasing means are coupled to the conductance monitoring means to receive the feedback signal and provide a bias voltage in response to the feedback signal. The bias voltage is applied to a gate of the MOSFET. The biasing means control the bias voltage so that it is less than a threshold voltage necessary to bias the MOSFET into conductance in the reverse direction, but sufficient to minimize conductance through a body diode portion of the MOSFET in the forward direction. The biasing circuit thus operates the MOSFET as a channel diode.

In one embodiment, the monitoring means comprise a voltage comparator having inverting and non-inverting inputs and an output. An input resistor couples the source and the drain of the MOSFET to the inverting and non-inverting inputs of the voltage comparator.

Another embodiment of the biasing circuit includes a diode having two terminals, one of which is coupled to either the drain or the source, and a resistor having one end coupled to either the inverting or non-inverting input of the voltage comparator and to either the source or the drain of the MOSFET. The other end of this resistor is coupled to the input resistor and to another terminal of the diode. Current flow through the diode corresponds to current flow through an internal body diode of the MOSFET and a voltage drop across the resistor is indicative of current flow through the internal body diode.

Yet another embodiment of the bias circuit includes current comparator means for monitoring current flow through a channel diode and controlling a bias voltage applied to a gate of the channel diode as a function of the current flow exceeding a predefined level, to operate the channel diode in a dynamic conduction mode, with increased conductance. This bias circuit also includes leakage monitoring means that monitor a leakage current flowing through the channel diode and control a voltage applied to the gate of the channel diode to compensate for variations in leakage when the channel diode is conducting current in a static mode. The current comparator means introduce a negligible forward voltage drop.

A method for biasing a majority charge carrier to conduct an electrical current in a forward direction and to block the flow of electrical current in a reverse direction through the device is another aspect of the present invention. The steps comprising the method are generally consistent with the functions implemented by the elements of the apparatus discussed above.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Conduction of current between a source and a drain of a conventional metal oxide semiconductor field effect transistor (MOSFET) is normally controlled by the voltage applied to a gate of the device. A MOSFET is a majority carrier device without any conductivity modulation by minority carriers. When the gate voltage applied to a MOSFET is greater than a threshold value, $V_T$, the MOSFET conducts through a channel developed between its drain and source. To increase the breakdown voltage and the current density in power MOSFETs, a vertical structure such as that shown in FIG. 1 (prior art) is used. In this illustration and in other instances throughout this disclosure, a "+" is used in connection with an "N" (or a "P") to denote a region doped with a relatively high percentage of negative (or positive) charge carriers, while the term "N–" (or "P–") is used to denote a region with substantially fewer negative (or positive) minority charge carriers.

Figure 1:
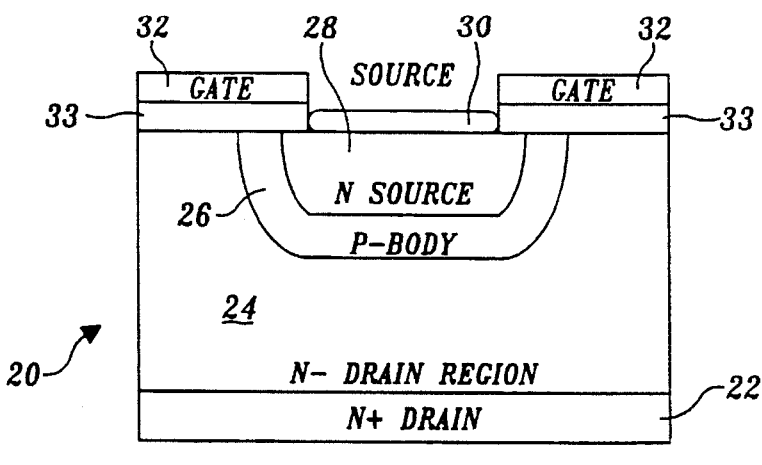
FIG. 1 (prior art) is a schematic cross-sectional diagram showing in elevational view the configuration of a conventional power MOSFET device.

A MOSFET configuration 20, shown in FIG. 1, comprises an N+ drain 22 deposited on a substrate (not shown) over which an N– drain region 24 is applied. A P-body region 26 is diffused into or otherwise deposited on the N– drain region and extends between dielectric oxide layers 33 to which gate electrodes 32 are applied. An N source region 28 is diffused or deposited in the P-body well, and a source terminal 30 is applied to the N source region. MOSFET configuration 20 is typically replicated in a plurality of adjacent cells (not shown), the different electrodes of these cells being connected to pads for a gate lead, a source lead, a drain lead, or in some cases, to a body lead of the MOSFET device (none of the leads or pads are shown). The configuration and methods for manufacturing conventional MOSFET devices is well known to those of ordinary skill in the art and need not be discussed in detail in this disclosure.

The conventional MOSFET device illustrated in FIG. 1 can be operated as a channel diode if its gate is biased appropriately. There is an advantage to using a MOSFET device as a diode in high voltage rectification applications, because N– drain region 24 provides high voltage capability, just like the v base region of a P-v-N diode. However, in a MOSFET device, there is no minority carrier injection like that used in a P-v-N diode.

Normally in the N-channel vertical power MOSFET configuration 20, current flows from the drain to the source, as the gate-source voltage is raised above a threshold value, $V_T$. However, when operated as a channel diode in accordance with the present invention, current instead flows from source terminal 30 to N+ drain 22. Accordingly, the source and drain terminals of the N-channel MOSFET correspond to the anode and cathode of the channel diode, respectively.

In order to operate a MOSFET as a channel diode, the gate-source voltage, $V_{GS}$, is set slightly below the threshold voltage, $V_T$, so that the gate potential creates a weak inversion layer in a channel that is formed in P-body region 26. However, negligible conduction occurs between source terminal 30 and drain 22 so long as the channel is thus weakly inverted. Furthermore, when a positive drain-source voltage, $V_{DS}$, is applied, the inversion near N– drain region 24 decreases or becomes nonexistent. However, when the drain-source voltage, $V_{DS}$, becomes negative, a strong inversion layer forms in P-body region 26, providing a conductive channel between the drain and source through which electrical current readily flows. When operating in this manner, the MOSFET is referred to as a channel diode.

Figure 2:
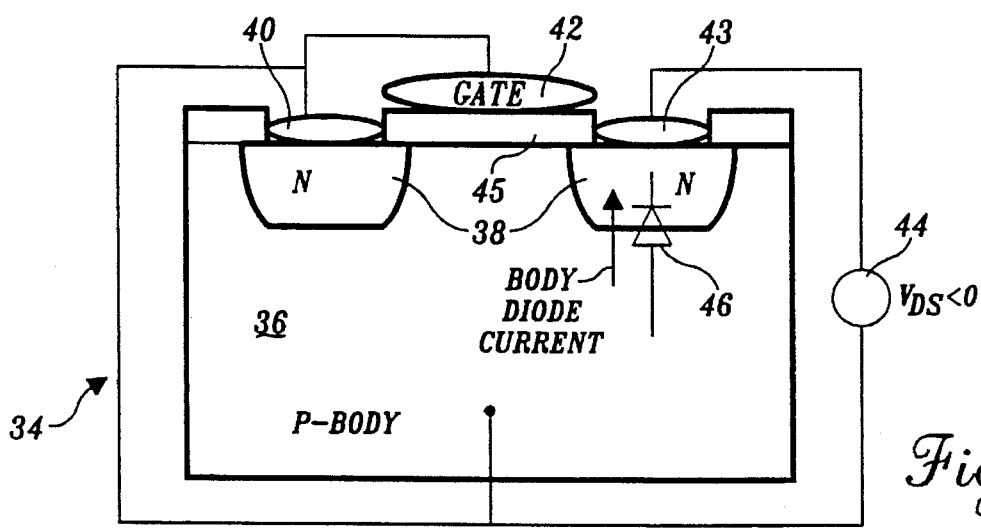
FIG. 2 is a schematic diagram illustrating the body diode electrical current flow path through a MOSFET device.
Figure 3:
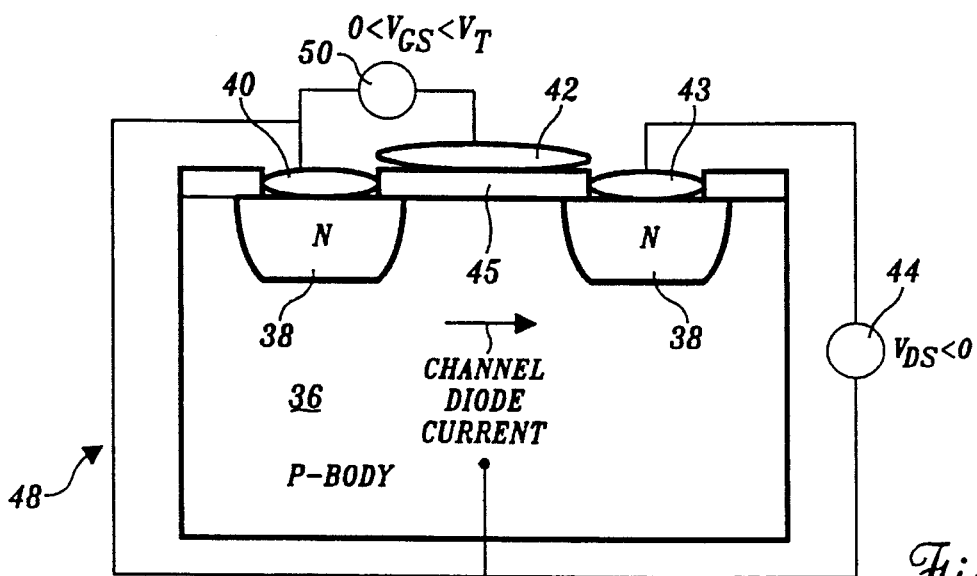
FIG. 3 is a schematic cross-sectional diagram showing in elevational view a MOSFET device biased to operate as a P-body channel diode, in accordance with the present invention.

Lateral configuration majority charge carrier devices are shown in the circuits of FIGS. 2 and 3, to illustrate that the present invention is not limited to a vertical configuration like that shown in FIG. 1. In the circuits using these lateral configuration majority charge carrier devices, a P-body region 36 is connected electrically to a source electrode 40 and to a voltage source, $V_{DS}$, as indicated at reference numeral 44. Two spaced-apart N regions 38 are diffused or otherwise deposited in P-body region 36; one of these N regions is connected electrically to source electrode 40 and the other is connected to a drain electrode 43. A gate electrode 42 is applied to an underlying oxide dielectric layer 45 that extends between the source and drain electrodes. In a circuit 34 (FIG. 2), gate electrode 42 is not properly biased to support channel diode operation. For this majority charge carrier device, the negative drain-source voltage is insufficient to create strong inversion in the channel formed in P-body region 36 of the device. Instead, the drain-to-body internal path of the device becomes a forward biased diode before channel conduction can occur. This drain-body portion of the majority charge carrier is referred to as a "body diode." When the body diode becomes forward biased, a body diode current begins to flow, as indicated by the vertical arrow in FIG. 2. A diode 46 schematically represents the body diode within P-body region 36 that is conducting current under these conditions.

In contrast, a circuit 48 that biases the majority charge carrier device to operate as a channel diode is shown in FIG. 3. The device in circuit 48 conducts current through the inversion layer channel formed in P-body region 36, between the source and drain. This channel is formed when: (a) the drain-source voltage is less than zero, and (b) the gate-source voltage (provided by a supply 50) has a magnitude just below the threshold voltage, $V_T$. It is important to note that the primary difference between conventional MOSFET operation of a majority charge carrier device, and channel diode operation of the device is that the level of inversion within the channel formed in P-body region 36 is controlled by $V_{DS}$ for the channel diode mode of current conduction, and by $V_{GS}$ for the MOSFET.

Figure 4:
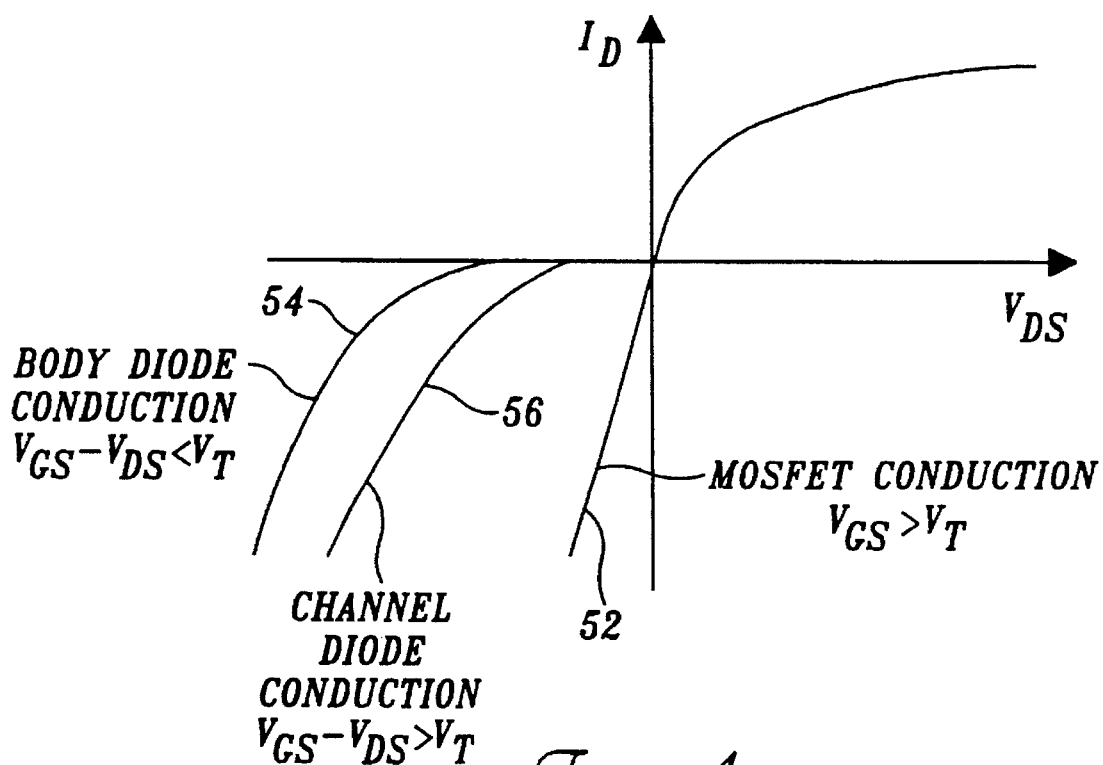
FIG. 4 is a graph of current and voltage for three operating conditions of the channel diode at different gate and drain voltages, relative to a threshold voltage.

In FIG. 4, a current voltage characteristic diagram that illustrates the three third quadrant modes of conduction for a majority charge carrier device. A current-voltage characteristic of a conventional MOSFET is shown by a line 52, for the normal gate bias condition wherein $V_{GS} > V_T$. A line 54 corresponds to the current-voltage characteristic for body diode conduction that occurs when $V_{GS} - V_{DS} < V_T$. Finally, the current-voltage characteristic of channel diode conduction, which occurs when $V_{GS} - V_{DS} > V_T$, is shown by a line 56.

Derivation of I–V Characteristic for Channel Diode Conduction

The channel diode current-voltage characteristic can be derived using the δ-depletion approximation. The depletion width in this approximation is assumed to increase with positive gate bias until a semiconductor surface inverts and the depletion width under the gate of the semiconductor device is at its maximum value. The surface potential, $\phi_S$, is equal to twice the Fermi potential in the P-body region of the device. Acceptor sites in the P-body region, which are a source of the depletion bulk charge, are assumed to be fully ionized. Any further increase in the surface potential, $\phi_S$, caused by increasing the gate bias, produces inversion charges that reside in an extremely narrow portion of the semiconductor-oxide interface. Thus, inversion charge can be approximately represented by a sheet charge, or a δ function extending in the direction between the source and drain as shown by the arrow in FIG. 3.

Once an inversion layer is formed in P-body region 36, channel current flows by drift. An electric field s extending in the direction of the arrow representing the flow of channel diode current in FIG. 3 is determined by the channel voltage $V_{DS}$. Since all of the drain current must flow through the channel, the drain current, $I_D$, can be found by integrating the current density over the cross sectional area.

In a MOSFET, the drain current is defined by:

$$I_D = -Z \frac{\mu}{L} \int_0^{V_{DS}} Q_I(V) dV \tag{1}$$

where μ is the surface carrier mobility, $Q_I(V)$ is the inversion charge per unit area, $V_{DS}$ is the drain-source voltage, and Z and L are the channel width and length, respectively. The derivation for the channel diode current-voltage characteristic differs from that of a MOSFET thus far, only in that the voltage or potential in the direction of the channel, $V_{Channel}$ and $V_{DST}$ are negative, as in the following expression:

$$I_D = -\frac{Z\mu}{L} \int_{V_{DST}}^{V_{DS}} Q_I(V) dV \tag{2}$$

In Equation (2), $V_{DST}$ is the drain threshold voltage for inversion, which is defined as the drain voltage that must be applied to cause the semiconductor surface to enter an inverted state.

In most channel diode structures, the P-body doping level, $N_A$, is relatively high, on the order of $10^{16}$ cm$^{-3}$, causing the bulk depletion charges to be an important factor in the derivation of current-voltage characteristics. As the drain voltage becomes more negative, the bulk depletion width, W, decreases, and charges are added into the inversion layer. Thus, the negative drain voltage tends to enhance the inversion layer. This effect is especially significant when the gate voltages are low, as in the case of the channel diode.

When no channel bias is present, the bulk depletion width can be expressed as follows:

$$W = \left[ \frac{2K_S}{qN_A} (2\phi_{F_p} + V_{SB}) \right]^{1/2}$$

where Q is the electron charge, $K_S$ is the semiconductor permittivity, $\phi_{F_p}$ is the body Fermi potential, and $V_{SB}$ is the source-body voltage.

When $V_{DS}$ is applied across the channel, the width of the bulk depletion as a function of position y in the channel is defined by:

$$W(y) = \left[ \frac{2K_S}{qN_A} (2\phi_{F_p} - V(y) + V_{SB}) \right]^{1/2} \tag{4}$$

Again, in contrast to MOSFET operation, $V_{DS}$ is negative, and thus, the depletion charge near the drain is decreased.

The inversion charge per unit area at the surface, $Q_I(V)$ is expressed by:

$$Q_I(V) = -C_{ox}(V_{GS} - V_{FB} - 2\phi_{F_p} - V(y)) + qN_A W(y) \tag{5}$$

where W(y) is the actual bulk depletion width along a channel, $V_{FB}$ is the flat band voltage, and $C_{ox}$ is the gate oxide capacitance per unit area.

The conventional gate-threshold voltage, $V_T$, is related to $\phi_{F_p}$ by:

$$V_T = 2\phi_{F_p} + V_{FB} + \frac{\sqrt{2qK_S N_A}}{C_{ox}} \sqrt{2\phi_{F_p} + V_{SB}} \tag{6}$$

The inversion charge, $Q_I(V)$, can be determined from the following relationship:

$$Q_I(V) = -C_{ox}[(V_{gs} - 2\phi_{F_p} - V(y)) - \gamma(2\phi_{F_p} + V(y) + V_{SB})^{1/2}] \tag{7}$$

where $$\gamma = \frac{\sqrt{2qK_S \epsilon_0 N_A}}{C_{ox}},$$

$V_{gs} = V_{GS}$, and $V_{GS}$ is the gate-source voltage.

The expression in Equation (7) is valid when $Q_I(V)$ is <0. The drain-threshold voltage, $V_{DST}$, can be found by setting $Q_I(V) = 0$ in Equation (7). By replacing V(y) in Equation (7) with $V_{DST}$, the following is obtained:

$$V_{DST}^2 - V_{DST}(\gamma^2 + 2(V^{gs} - 2\phi_{F_p})) + ((V_{gs} - 2\phi_{F_p})^2 - \gamma^2(2\phi_{F_p} + V_{SB})) = 0 \tag{8}$$

Solving quadratic Equation (8) for $V_{DST}$, the following is obtained:

$$V_{DST} = -\frac{\gamma^2}{2} + (V_{gs} - 2\phi_{F_p}) + \frac{\gamma}{2}(\gamma^2 + 4V_{gs} + 4V_{SB})^{1/2} \tag{9}$$

In order to obtain the current voltage relationship, Equation (1) must be integrated along the channel length using Equation (7), yielding:

$$I_D = \tag{10}$$

$$\frac{ZC_{ox}\mu}{L} \left( (V_{gs} - 2\phi_{F_p})(V_{DS} - V_{DST}) + \frac{1}{2}V_{DST}^2 - \frac{1}{2}V_{DS}^2 - \frac{2}{3}\gamma((2\phi_{F_p} + V_{SB} + V_{DS})^{3/2} - (2\phi_{F_p} + V_{SB} + V_{DST})^{3/2}) \right)$$

Equation (10) is valid only if $V_{DS} < V_{DST} < 0$. In a MOSFET, the existence of bulk depletion charge tends to decrease the channel conductance, while in a channel diode (or MOSFET biased to operate as a channel diode), the bulk depletion charge tends to increase the conductance of the channel for negative values of $V_{DS}$. The depletion charge near the drain end of the channel disappears when $V_{DS}=2\phi_{Fp}+V_{SB}$.

If a vertical structure majority charge carrier device like that of FIG. 1 is used for the channel diode, the bulk resistance, $R_d$, of the drift region is a major part of the ON resistance. In general, the drift region length is on the order of 20 μ and the doping level is on the order of $10^{15}$ cm$^{-3}$ for such a device. The drift region's ON resistance becomes especially high in the case of high voltage devices. Accordingly, the current-voltage relationship developed above must be modified to accommodate the effect of $R_d$, which reduces the voltage drop across the channel, $V_{DS_{LATERAL}}$. Equation (10) must thus be modified to make $V_{DS}$ equal to the sum of the voltages across the channel plus the drift region of a vertical channel diode, as represented by the following:

$$V_{DS_{LATERAL}} = V_{DS_{LATERAL}} + I_D R_d \tag{1}$$

Equation (11), together with Equation (10), fully describes the vertical channel diode I–V characteristics. The effect of gate bias and body bias on a channel diode's I–V characteristics is indicated in Equation (10), and has been experimentally verified. In contrast, a conventional diode's characteristics are fixed during its manufacture and cannot subsequently be modified by application of an external signal. For example, in a channel diode, a negative body bias increases the turn-on voltage of the body diode, and thus, extends the channel diode region of operation. However, a negative body bias also increases the turn-on voltage of the channel formed in P-body region 36 and reduces the conductivity of the channel diode. Considering these two effects together, it is preferable to apply a zero bias potential to P-body region 36 for most applications of the channel diode.

Preferred Structure for a Channel Diode—In Contrast to a MOSFET

Although a MOSFET can be biased to operate as a channel diode, a conventional power MOSFET structure, such as that shown in FIG. 1, is not optimum for channel diode operation. In a power MOSFET, the channel width (measured in a direction transverse to the planar cross section shown in FIG. 1 ) is kept small to minimize gate-source capacitance. This design consideration for MOSFETs is possible because the major component of ON resistance for operation of the device in its conventional mode is represented by the drain drift region, rather than the channel region in P-body region 36 that is formed when the device operates as a channel diode. If a MOSFET device is used for a channel diode, channel resistance becomes a major component of the total ON resistance, due to the relatively low level of inversion that can be achieved in the channel region of P-body region 36 in the MOSFET. Accordingly, cellular geometries employed in power MOSFET design are preferably modified to increase the channel conductance when designing a more optimal structure that is intended to function specifically as a channel diode.

Figure 5:
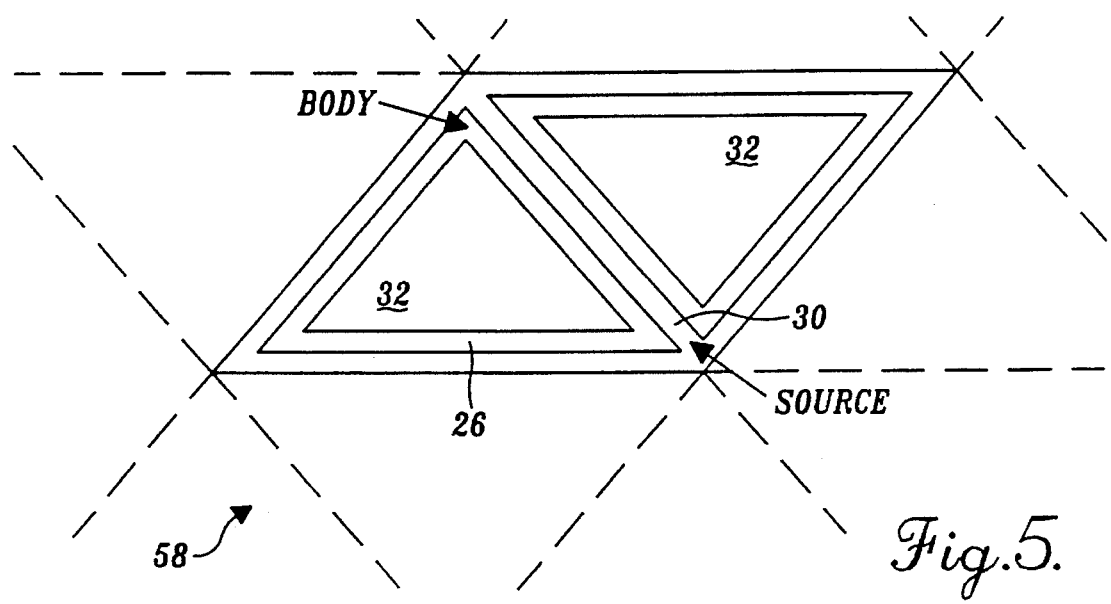
FIG. 5 is a plan view of a linked-cell configuration, illustrating only two of a plurality of channel diode cells comprising a channel diode device.

FIG. 5 shows a plan view of part of a preferred channel diode configuration referred to herein as a "linked-cell" geometry, which increases the channel width to compensate for the relatively low level of inversion in the channel region that occurs during channel diode conduction. Another approach for increasing the conductance of a channel diode device is to reduce the thickness of the oxide layer (corresponding to oxide layer 33 as shown in FIG. 1) underlying the gate electrode from its typical value of approximately 100 nanometers for a power MOSFET structure, to approximately 20 nanometers in a channel diode. This reduction of the oxide layer thickness increases conductance by an additional factor of five. The extent to which the thickness of the oxide layer can be reduced is limited only by the prospect of hot electron injection, which can occur if the oxide layer becomes too thin.

Critical parameters of the linked-cell geometry channel diode, like that shown in FIG. 5 and of a linked-cell configuration with reduced oxide thickness are compared to corresponding parameters of the typical cell configuration power MOSFET in Table 1, which follows below. In both the linked-cell channel diode and conventional MOSFET cell geometry, a typical unit cell area of approximately 584.4 μm$^2$ and a channel length of 2 μm is assumed. In addition, a typical drain area of 325.5 μm$^2$ is used for both types of devices in this comparison, to provide the same drain conductance for both the conventional and linked-cell geometries. The use of a linked-cell geometry for the channel diode device results in a slight loss in the source area, which is not expected to have a significant impact on performance. A substantially higher gate-source capacitance occurs in the linked-cell geometry compared to the conventional cell geometry; however, channel diode performance is not effected, since its gate electrode is DC biased.

TABLE 1

| Geometry | Channel Width (μm) | $X_{OX}$ (nm) | $C_{GS}$ (pF/cell) | Relative Conductance | Source Area (μm$^2$) |
|---|---|---|---|---|---|
| Hexagonal | 60 | 100 | 0.090 | 1 | 166.3 |
| Linked-Cell | 88.5 | 100 | 0.090 | 1.5 | 150.0 |
| Linked-Cell & Reduced Oxide | 88.5 | 20 | 0.45 | 7.5 | 150.0 |

In actually constructing a channel diode device, a minimum practical gate oxide thickness, channel width, and drain area are used to achieve optimum conductance. Since any increase in channel width is at the expense of an active drain area, an optimum value for channel conductance is obtained by setting the sum of drain and channel conductance to a minimum value. Channel resistance $R_{CH}$ can be expressed as follows:

$$R_{CH} = \frac{1}{2\mu_{ns} C_{ox}(V_{GS} - V_T - V_{CH})} \frac{L}{A} \tag{12}$$

where L is the channel length, A is the channel cross-sectional area, and $V_{CH}$ is the voltage across the channel.

A drift region resistance, $R_d$, is a strong function of the device reverse breakdown voltage, VB, and is expressed by:

$$R_d = 5.93 \times 10^{-9} VB^{2.5} \tag{13}$$

Thus, for an oxide layer thickness of 100 nanometers, the sum of the channel and drain resistance is a minimum when the channel width is 130 μ. Similarly, for an oxide layer of thickness of 20 nanometers, the sum of these two resistances occurs when the channel width is 85 μ. An additional increase in channel width above the minimum occurs at the expense of drain area and does not provide an overall reduction in ON resistance. The optimum channel width thus varies for different oxide thicknesses, unit cell sizes, and breakdown voltages of the channel diode, which are defined by its intended application.

A reduction in channel length significantly increases the channel conductance without reducing the drain conductance of the channel diode device. Most power MOSFETs have a 2 μ channel length; however, power MOSFETs with a 1 μ channel length are becoming commercially available. A reduction in channel length by a factor of two causes an increase in channel conductance by a factor of two. As fabrication technology continues to advance, further reduction in channel length is likely.

Experiments have shown that a channel diode can be adjusted to maintain a constant low forward voltage through a relatively wide temperature range. These experiments have also shown that it is possible to maintain substantially constant I-V characteristics over a temperature range from −65° C. through 125° C. by appropriately adjusting the value of the gate-source voltage, $V_{GS}$.

Channel Diode Bias Circuits

In accordance with the present invention, a majority charge carrier device requires an appropriate DC gate bias for proper operation as a channel diode. If the gate bias voltage is insufficient, body diode conduction occurs in the majority charge carrier device instead of channel diode conduction. On the other hand, it is important that the gate of the channel diode be biased below the threshold voltage, $V_T$, to avoid MOSFET conduction (see FIG. 4). Ideally, the $V_{GS}$ bias voltage should be as close to $V_T$ as possible. The turn-on voltage of a channel diode, $V_{DST}$, is equal to the difference between $V_{GS}$ and $V_T$. In practice, $V_{DST}$ is set to a value greater than 0.1 volt to provide a margin of reliability.

When operated as an active switch, a power MOSFET has a typical gate bias of 10 volts applied during conduction, which is about 7 volts above the threshold voltage, $V_T$. In comparison, a channel diode is typically operated with a $V_{DS}$ only a few tenths of a volt above $V_{DST}$. As a result, the level of inversion in the channel diode is much less than that of a power MOSFET. The relatively lower level of inversion in the channel formed in the body of the channel diode results in a much lower conductivity compared to a MOSFET and causes the channel diode to have a higher voltage drop during forward conduction. At high current levels, the channel diode's forward voltage drop can easily approach the turn-on voltage of the body diode, causing body diode conduction to carry a significant part of the total current. However, since the body diode conduction mode of a majority charge carrier device has a much longer reverse-recovery time than a conventional power diode (typically on the order of 1 μs), the parallel conduction of current through both the body diode and the channel must be avoided in the channel diode if possible. For this reason, an impedance is preferably placed in series with the body terminal of a channel diode in power conversion applications to limit body diode conduction. At relatively higher current levels, this series impedance causes a negative body bias to be applied to the channel diode, preventing the internal body diode from becoming significantly forward biased. However, the negative body bias reduces the channel diode conductivity, as predicted by Equation (10). Therefore, any bias circuit used with the channel diode must account for the effect of a negatively biased body diode. An optimum solution is to have a minimum negative body bias, while preventing body diode conduction.

The addition of an impedance in series with a body of the channel diode also makes it more susceptible to a second source of breakdown. If a current sensing biasing Circuit is used to control the channel diode, the impedance introduced in the body diode conduction path is optimally maintained at a minimum; a low voltage Schottky diode can be placed in parallel witch this impedance to clamp the voltage drop.

Figure 6:
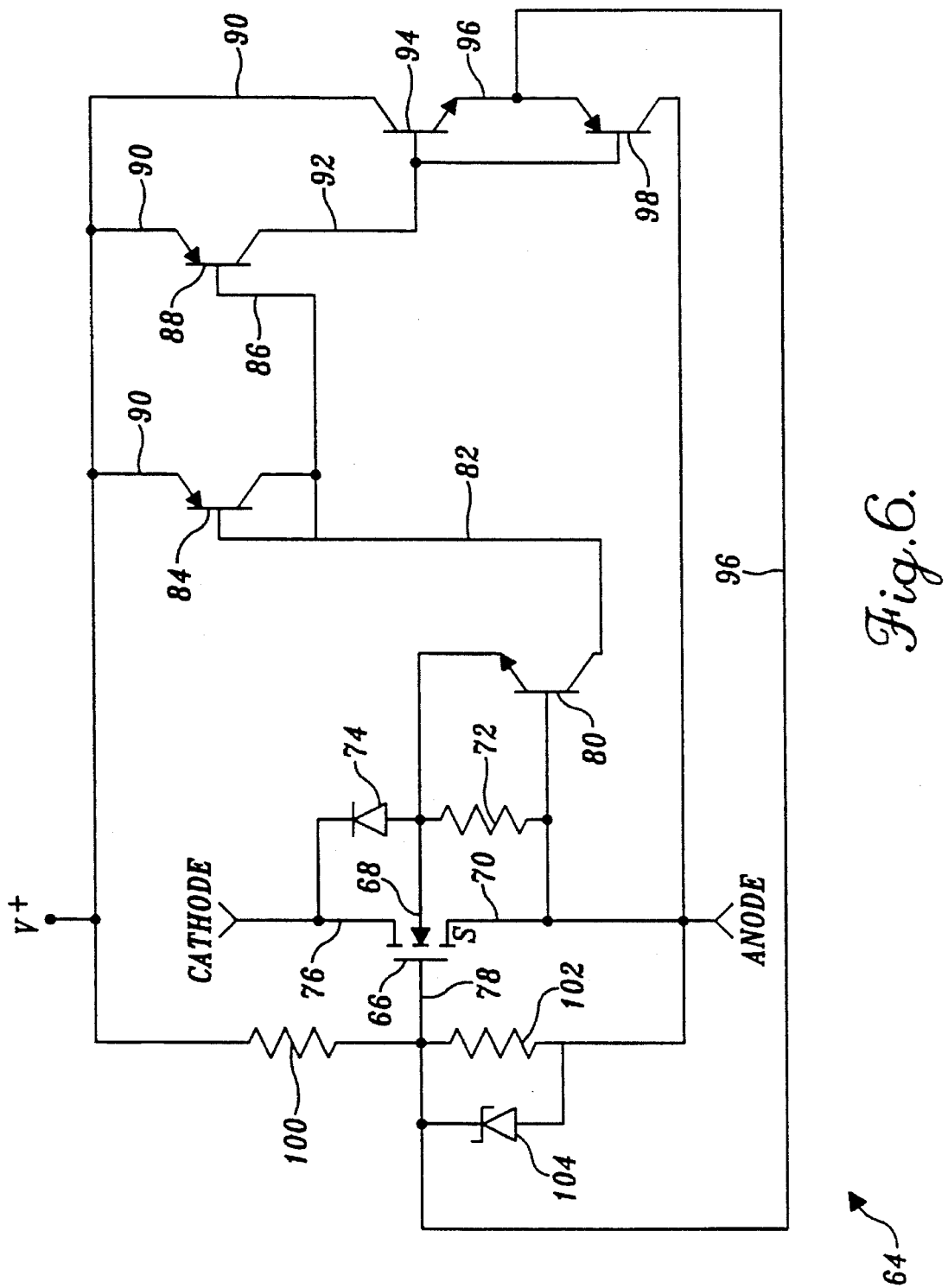
FIG. 6 is an electrical schematic diagram of a quasi-dynamic bias circuit for use in controlling a majority charge carrier device so that it operates as a channel diode.

A quasi-dynamic channel diode bias circuit 64 is shown in FIG. 6 controlling a channel diode 66. In testing the operation of bias circuit 64, a type 3N171 small signal MOSFET was used as channel diode 66 in lieu of a majority charge carrier device specifically designed as a channel diode. (The small signal MOSFET was selected for this purpose, since power MOSFETS are generally not available with separate body connections.) Furthermore, an external diode 74 was connected between a body connection 68 and a drain lead 76 of the MOSFET used for channel diode 66 to represent a body diode conduction path. However, it should be recognized that in a channel diode device implemented with an optimum configuration as discussed above, external diode 74 would not be used, since internal body diode conduction would more readily be directly sensed.

To sense body diode current, a resistor 72 is provided between body connection 68 and a source lead 70. One end of resistor 72 is connected to the gate of an NPN transistor 80 to monitor body diode current flow. The emitter of NPN transistor 80 is connected back to the junction of resistors 72 and diode 74 to monitor the voltage drop across resistor 72. In response to the body current, a PNP current mirror comprising transistors 84 and 88 is activated by current carried on a lead 82, which is connected to the base of these PNP transistors and to the collector of PNP transistor 84. Transistors 84 and 88 have emitters that are coupled through a lead 90 back to a resistor 100, the other end of which is connected to a gate lead 78 of channel diode 66 and to one end of a resistor 102. Lead 90 is also connected to the cathode of an NPN transistor 94, which has an emitter connected through a lead 96 to the emitter of a PNP transistor 98. Transistors 94 and 98 are connected in a push-pull configuration, with their bases connected through a line 92 to the cathode of PNP transistor 88. The common emitters of transistors 94 and 98 are connected through lead 96 to the node connection between resistors 100 and 102 through lead 96. The cathode of PNP transistor 98 is connected through source lead 70 to one end of resistor 102 and to the anode of a zener diode 104, which has a cathode connected to lead 96. Zener diode 104 establishes a maximum voltage, $V_{GS}$, for channel diode 66.

When the voltage drop across resistor 72 indicates that the body current has achieved a six milliamp level (at least in this particular exemplary bias circuit), NPN transistor 80 turns on, and the current mirror comprising PNP transistors 84 and 88 actuates push-pull transistors 94 and 98 to force more current through the voltage divider comprising resistors 100 and 102, which increases the gate bias voltage above its minimum value, $V_{GSC}$. A minimum gate bias voltage of 0.5 volts is maintained in this embodiment of dynamic bias circuit 64, when there is no conduction through channel diode 66, and a maximum value for $V_{GS}$ of 1.5 volts is achieved during conduction between the anode and cathode (source and drain) terminals of the channel diode.

It has been found for this embodiment of dynamic bias circuit 64 that the gate bias falls from 1.5 volts to 0.5 volts in slightly over 300 nanoseconds. This relatively slow response of dynamic bias circuit 64 is acceptable, provided that the maximum gate bias remains below $V_T$, thereby preventing conduction of the channel diode in the reverse direction. Use of dynamic bias circuit 64 significantly increases the current level achieved by channel diode 66, compared to its operation with simply a static gate bias voltage applied. However, dynamic bias circuit 64 requires a minimum of 0.6 volts drop be developed across current sensing resistor 72 before the channel diode gate voltage is increased. This requirement causes a relatively high forward voltage drop to occur at higher current levels.

Figure 7:
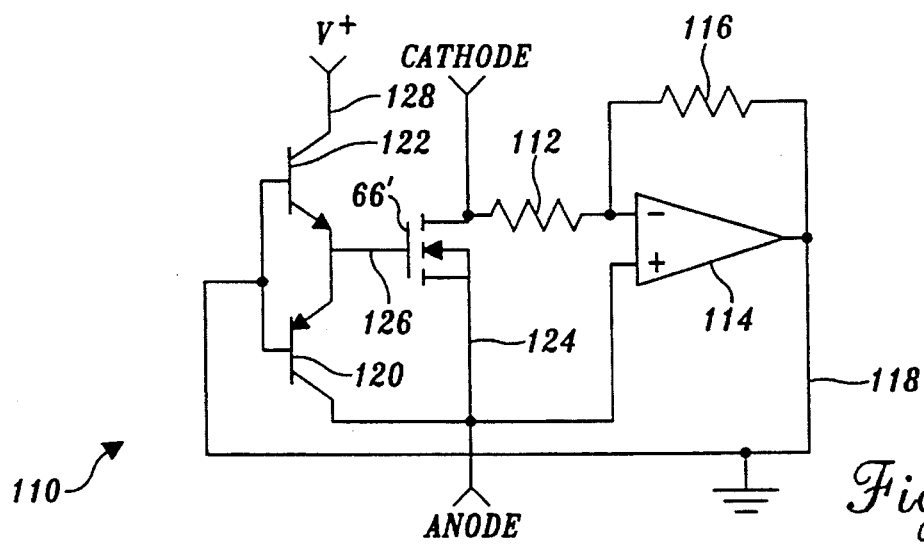
FIG. 7 is an electrical schematic diagram of a voltage sensing differential negative feedback bias circuit.

By using a differential amplifier to respond to body current, a much more sensitive dynamic bias sensing capability can be achieved. The effective gate voltage of the channel diode is increased, while its body diode bias is kept relatively low. An appropriate negative feedback dynamic bias circuit 110, based on voltage sensing using such an amplifier, is shown in FIG. 7, and in FIG. 8, a current sensing differential negative feedback bias circuit 132 is shown.

Referring first to voltage sensing dynamic bias circuit 110 (in FIG. 7), a channel diode 66 includes a resistor 112 connected to its drain (the cathode terminal), the other end of resistor 112 being connected to the inverting input of a differential amplifier 114. A feedback resistor 116 connects the output of differential amplifier 114 to the inverting input. The non-inverting input of differential amplifier 114 is connected to a source lead 124 (comprising the anode terminal of the channel diode), which is also connected to a collector of a PNP transistor 120. PNP transistor 120 is used in connection with an NPN transistor 122 to form a push-pull configuration. The emitters of transistors 120 and 122 are connected to the gate of channel diode 66', and the collector of NPN transistor 122 is connected to a voltage source through lead 128. Although an external voltage source is implied and was actually used in testing this circuit, in practice, it is contemplated that the bias circuit would be integral with the channel diode, comprising a single, monolithic integrated circuit (IC). Furthermore, the voltage V+ would be derived from the cathode potential internally in this IC.

Differential amplifier 114 senses a differential voltage drop between the source and the drain, amplifying the signal to produce an output that controls push-pull transistors 120 and 122, and, thus, controls the voltage applied to the gate of channel diode 66' as a function of the drain-source voltage. The channel diode gate voltage is increased at the threshold of forward biasing. For use in high voltage applications, differential amplifier 114 must be a high voltage design characterized by an appropriate voltage rating. Tests of dynamic bias circuit 110 have shown that the current waveforms for conductance between the source and drain of channel diode 66' are delayed by approximately 25 nanoseconds relative to corresponding voltage waveforms. In these tests, a minimum gate voltage, $V_{GSC}$, of 1 volt was maintained when channel diode 66' was not conducting, and the gate voltage was increased to 2.3 volts by differential amplifier 114 when the channel diode was conducting. A bias circuit delay or response time of 300 nanoseconds was measured. However, since the maximum gate voltage is limited to a value less than $V_T$, this delay did not cause reverse conduction by the channel diode.

Figure 8:
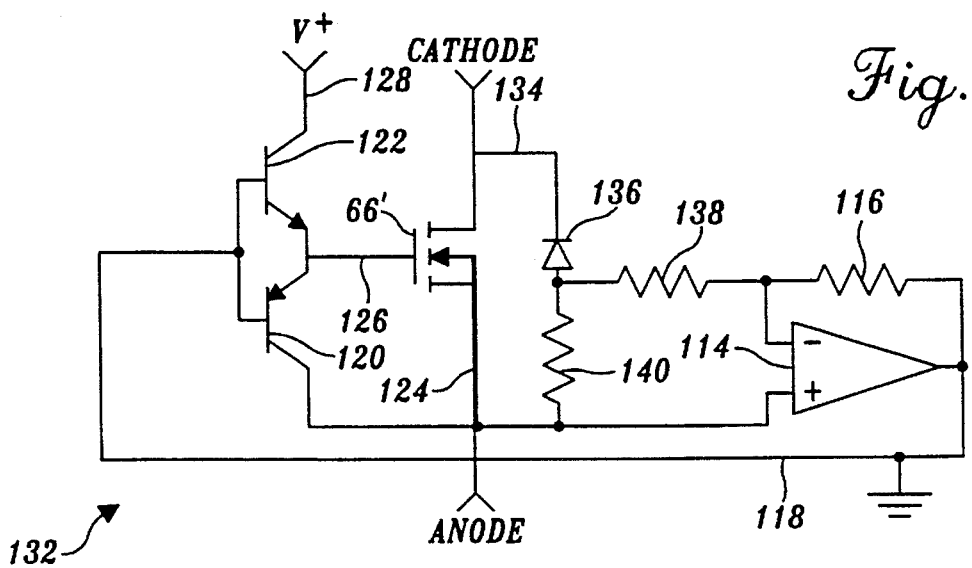
FIG. 8 is an electrical schematic diagram of a current sensing differential negative feedback bias circuit.

For bias circuit 132 in FIG. 8, an external UFR (a type MUR806) diode 136 was placed in parallel with a power MOSFET (a type IRF 531) used as channel diode 66' to test the circuit's capability. However, it will be understood that a true channel diode device would not require an external UFR diode 136 and that UFR diode 136 as used in connection with channel diode 66' simply represents the internal body diode within a majority charge carrier device specifically fabricated as a channel diode.

The source terminal of channel diode 66' is connected through lead 124 (the anode terminal) to one end of a resistor 140, the other end of the resistor being connected to the cathode of diode 136 and to a resistor 138. The opposite end of resistor 138 is connected to the inverting input of differential amplifier 114. Feedback resistor 116 is connected from the output of differential amplifier 114 to its inverting input. The output of differential amplifier 114 is also connected to the bases of transistors 120 and 122, which are again connected in a push-pull configuration, the collector of NPN transistor 122 being connected to a V+ source through lead 128, and the collector of PNP transistor 120 being connected to the source lead of channel diode 66' and to the non-inverting input of differential amplifier 114. Resistor 140 is connected from the source lead to the cathode of body diode 136, enabling differential amplifier 114 to sense the body current as a function of the voltage drop across resistor 140. In response to electrical current flow through the body of channel diode 66', the output from differential amplifier 114 causes transistors 120 and 122 to control the gate voltage, $V_{GS}$ applied to channel diode 66'.

For both current and voltage monitoring dynamic bias circuits 110 and 132, respectively, the forward voltage drop across channel diode 66' is simply a function of its ON-conductance and forward current level. The ON-conductance of channel diode 66' is limited because the maximum gate voltage must be less than $V_T$. The relatively low ON-conductance of the channel diode results in a forward voltage drop exceeding 0.6 volts at a relatively low current level. If the bias circuit used provides an insufficient gate voltage, or if the channel diode forward current is high, the internal body diode carries a large part of the forward current. Since the bias circuits are designed to drive the channel diode gate to a lower voltage, reducing the channel ON-conductance, a higher forward voltage drop for the same forward current results.

If a channel diode is intended to work at low voltages, the gate bias circuit must function to maintain $V_{DST}$ low and also to reduce the temperature coefficient of the channel diode. However, it should be recalled that the gate bias circuit is to be integrally packaged with the channel diode so that the channel diode device has only two terminals. As a result, the channel diode in such an integral package can readily maintain a low forward voltage drop over a relatively wide temperature range, since it is subject to the same temperature effects as the bias circuit.

As noted above, a major shortcoming of the basic channel diode is its relatively low ON-conductance, which causes a high forward voltage drop and, thus, an excessive loss during conduction. In addition, at high current levels, the higher forward voltage of the channel diode turns on the parallel body diode, which has a reverse-recovery much longer than that of a standard power diode. Accordingly, it is apparent that parallel conduction of the channel diode and its internal body diode should be avoided. The structural configurations of the channel diode device shown in FIG. 5 and discussed above improve the ON-conductance of the channel diode by increasing the channel width and decreasing the oxide thickness compared to a conventional MOSFET structure, enabling higher forward current before turn on of the body diode occurs. The negative feedback dynamic bias circuits shown in FIGS. 7 and 8 also improve the performance of the channel diode by holding its gate at a minimum voltage and sensing either the body diode conduction or channel diode cathode-anode bias to control the channel diode gate voltage, to increase channel diode conductance while controlling body diode conduction. In order to prevent the gate voltage from exceeding the threshold voltage $V_T$, the maximum gate voltage for the negative feedback bias circuit design is limited to a value below $V_T$. Otherwise, should $V_{GS}$ exceed $V_T$, the channel diode begins to conduct in the reverse direction. Because of this limitation in gate voltage, the conductance of the channel diode remains significantly lower than a power MOSFET and, at higher current levels, the body diode may still carry a significant part of the total ON current.

In order to make the channel diode ON-conductance similar to that of a power MOSFET, the gate voltage of the channel diode must be adjusted above $V_T$ once conduction through the channel has been initiated. However, a gate voltage, $V_{GS}$, greater than $V_T$ must be avoided when the channel diode is reverse biased. Thus, a two-state $V_{GS}$, including a high state, and a zero state, is necessary, and the transition between these two states should have a minimum delay.

The high state $V_{GS}$ is defined as the gate-source voltage that results in the channel diode and a comparable power MOSFET having similar ON-conductances. A positive feedback dynamic bias circuit 146, shown in FIG. 9, has the capability of controlling the gate-source voltage between these two states. In positive feedback dynamic bias circuit 146, a UFR diode 156 is again connected to the drain (cathode terminal) through a lead 158, but in this bias circuit, UFR diode 156 is not intended to represent the internal body diode of the channel diode. The source of channel diode 66' is connected through a lead 148 (anode terminal) to one end of a resistor 152, the other end of which is connected through a lead 154 to the anode of UFR diode 156. In addition, lead 154 is connected to the inverting input of a comparator 150, the non-inverting input being connected through lead 148 to the source of channel diode 66'. The output of comparator 150 is connected through a lead 160 to the bases of transistors 120 and 122, which are again configured in push-pull arrangement, their emitters being connected through lead 126 to the gate of channel diode 66'. Lead 128 again connects the collector of NPN transistor 122 to a voltage source (or to the cathode lead of the channel diode device when integrated with the bias circuit).

Resistor 152 is connected in series with UFR diode 156 so that when the UFR diode is forward biased (relative to the potential applied between the anode and cathode terminals), the forward current through the UFR diode causes a voltage drop across resistor 152 that is sensed by comparator 150. In response to the voltage drop across resistor 152, comparator 150 produces an output signal that drives the bases of transistors 120 and 122 to the relatively higher voltage level of the voltage source, V+, which corresponds to the "high state." Transistors 120 and 122 are required because of the relatively large channel diode gate capacitance. When channel diode 66' is reverse biased, the current through UFR diode 156 ceases, and the voltage drop across sensing resistor 152 changes polarity, causing the output of comparator 150 to go low and discharging the gate of channel diode 66'. Positive feedback dynamic bias circuit 146 thus forces the channel diode gate voltage well above $V_T$, making the channel diode ON-conductance very high when the channel diode is forward biased. However, any delay in the transition of $V_{GS}$ from the high state to the low state can permit reverse conduction. Some delay is unavoidable in the sensing, comparator, and gate charging components of bias circuit 146. If this delay is greater than the UFR diode reverse-recovery time, then the channel diode device offers no advantage over a conventional UFR diode.

The component of the delay time related to charging and discharging of the channel diode gate capacitance is a function of the channel diode current rating and the gain of the push-pull configuration comprising transistors 120 and 122. This component of the delay has a typical value of about 30 nanoseconds. An improvement to about 10 nanoseconds can be expected if a higher gain push-pull stage is used. A component of the delay associated with comparator 150 can be minimized by using a high-speed comparator, such as one of the MAXIM 900 series, which have a typical response time of 8 nanoseconds or less. Compared to the reverse-recovery current required by a conventional UFR diode, channel diode capacitance charging current is lower in magnitude and shorter in duration. A typical UFR diode has a recovery time of about 50 nanoseconds, compared to less than 35 nanoseconds for a channel diode. Although Schottky diodes have no observable reverse-recovery time, their voltage ratings are limited to less than 100 volts. In contrast, a channel diode device can handle voltages in excess of 600 volts.

Figure 9:
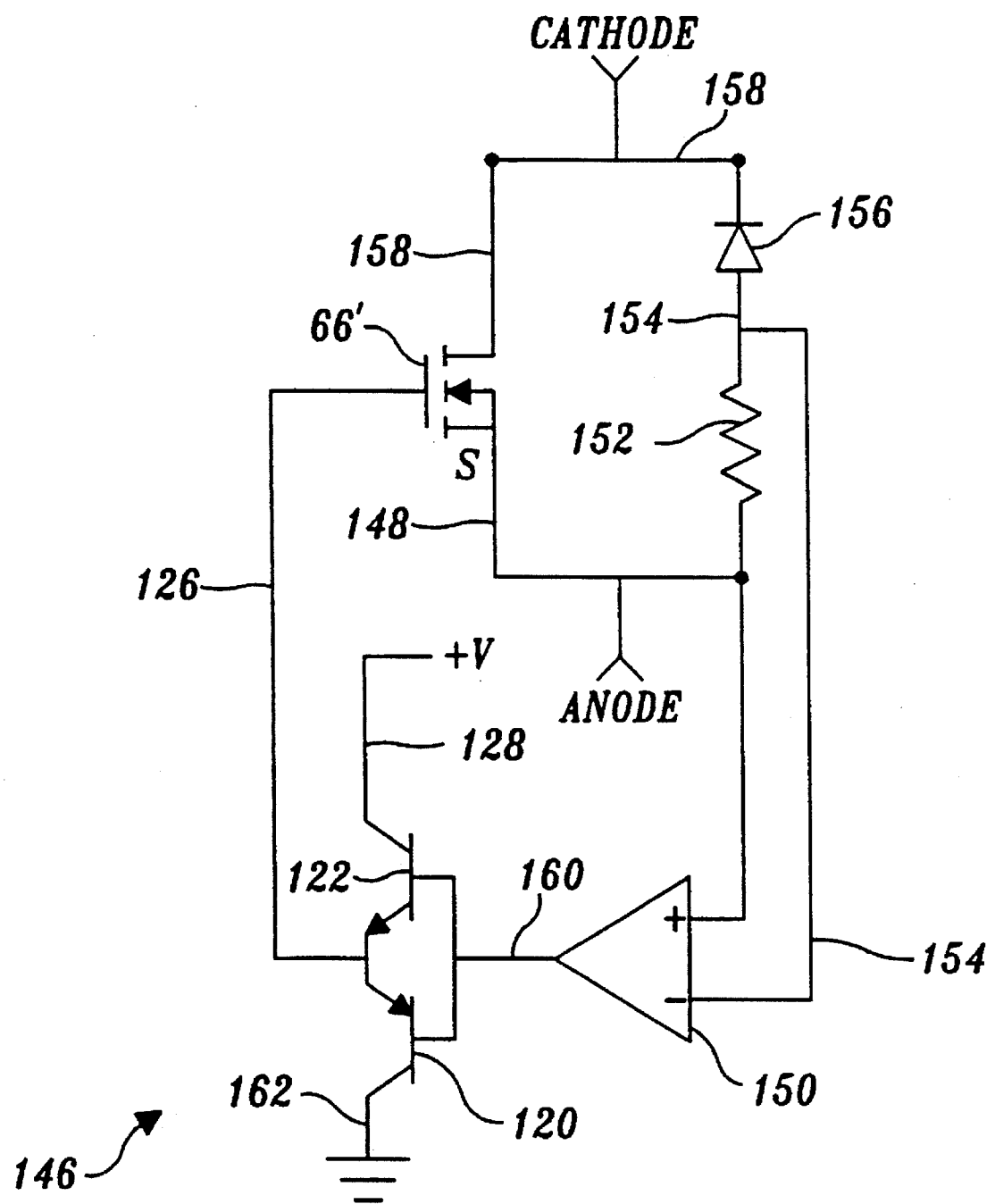
FIG. 9 is an electrical schematic diagram of a dynamic channel diode bias circuit that increases the conductance of a channel diode.

Positive dynamic feedback bias circuit 146 shown in FIG. 9 provides an improvement in ON-conductance without any structural modifications of the channel diode per se. This bias circuit therefore represents a substantial improvement over bias circuits 64, 110, and 132. A channel diode with the linked-cell configuration shown in FIG. 5 greatly increases the basic channel diode ON-conductance (compared to a conventional MOSFET structure biased to operate as a channel diode), while increasing the gate capacitance. As a result, a linked-cell configuration channel diode with DC gate bias can operate at a much higher current level than a conventional MOSFET geometry channel diode with DC gate bias. However, the turn on of the internal body diode in the linked-cell configuration channel diode during high forward current conditions is still possible because of the low ON-conductance. The negative feedback dynamic bias circuit using either voltage sensing, as in bias circuit 110, or current sensing, as in bias circuit 132, keeps the channel diode gate at the minimum voltage, $V_{GSC}$, when the channel diode is not conducting and drives the channel diode gate to a higher voltage for higher ON-conductance during forward bias conditions. Because of the relatively slow speed of the differential amplifier 114 in these two bias circuits, the source-gate voltage must be limited to less than $V_T$ to avoid channel diode conduction in the reverse direction. This requirement places a maximum limit on the channel diode ON-conductance and again risks turn on of the internal body diode at high current levels. It is important, therefore, to use the linked-cell configuration for these type bias circuits, because the channel diode gate voltage is limited to less than $V_T$.

In contrast, positive feedback dynamic bias circuit 146 uses a comparator to sense either voltage or the current indicative of the operating condition of the channel diode, driving the channel diode gate voltage well above $V_T$ during forward conduction, and turning off the gate bias voltage to block current flow when the channel diode should not be conducting. This benefit is achieved because comparator 150 has a much faster response time than differential amplifier 114.

The gate of channel diode 66' must be discharged before reverse conduction occurs. For operation with positive feedback dynamic bias circuit 146, a low gate capacitance is required, and thus, the standard power MOSFET geometry is better than the linked-cell geometry shown in FIG. 5. A summary of the characteristics for the three types of channel diode bias circuits is shown below in Table 2.

TABLE 2

Channel Diode Bias Circuit Characteristics

| | | NFBD | | PFDB | |
|---|---|---|---|---|---|
| Parameters | DC Bais | Current Sensing | Voltage Sensing | Current Sensing | Voltage Sensing |
| Rev. Recovery | None | None | None | None | None |
| $R_{ON}$ | High | Medium | Medium | Low | Low |

TABLE 2-continued

Channel Diode Bias Circuit Characteristics

| Parameters | DC Bais | NFBD | | PFDB | |
|---|---|---|---|---|---|
| | | Current Sensing | Voltage Sensing | Current Sensing | Voltage Sensing |
| Turn ON Delay | N/A | Slow | Slow | Medium | Fast |
| Response Time | N/A | Slow | Medium | Fast | Fast |
| Bias Complexity | Low | Medium | Medium | Medium | Medium |
| Second Breakdown Risk | None | Some | None | Some | None |
| Requirement for High Common Mode Amplifier Input | N/A | No | Yes | No | Yes |
| Structure | Linked-Cell | Linked-Cell/Std. MOSFET | | Std. MOSFET | |

Figure 10:
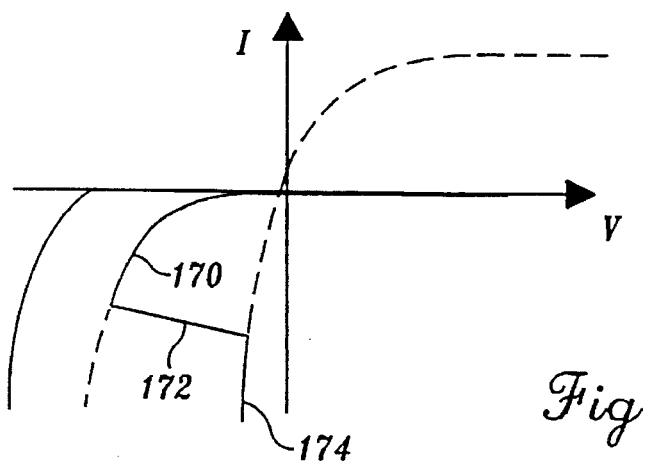
FIG. 10 is a graph of the voltage and current conductance of a channel diode as its conduction changes from static to dynamic mode.

FIG. 10 illustrates the current-voltage characteristics for a static channel diode conducting in the third quadrant at line 170, and for a dynamic diode conducting in the third quadrant at a line 174. Positive feedback dynamic bias circuit 146 enables an initial ON-conductance, along a static channel diode conduction path 170, followed by a transition as indicated by a line 172, to dynamic channel diode conduction, thereby increasing the ON-conductance of the channel diode. This increase in the ON-conductance is achieved by dynamically adjusting $V_{GS}$ with the dynamic bias circuit to a value higher than $V_T$. Use of a $V_{GS}$ exceeding the value of ($V_T+\Delta V$) during the ON-conduction state causes the conducting channel to become strongly inverted. A goal for a dynamic channel diode design is to reduce the gate voltage swing represented by the length of path 172 between the static channel diode conduction characteristic represented by line 170 and the dynamic channel diode conduction path represented by line 174. In other words, it is desirable to decrease the separation between the static and dynamic conduction states at which the transition between them occurs.

Figure 11:
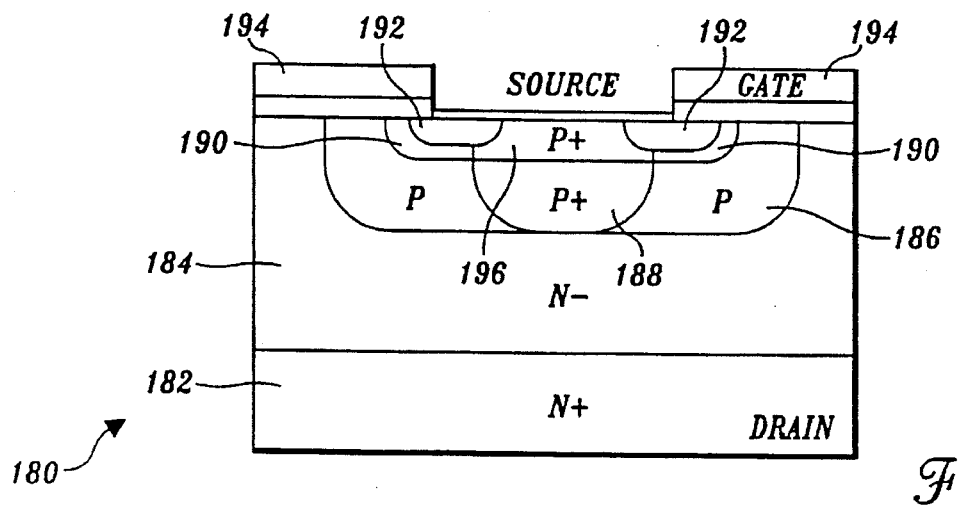
FIG. 11 is an elevational schematic cross-sectional diagram showing the configuration of a P-body channel diode in accordance with another embodiment of the present invention.

A majority charge carrier device configuration 180 for the channel diode that is directed to this objective is shown is FIG. 11. In configuration 180, a highly-doped N+ drain region 182 and a more lightly-doped N-region 184 are provided, just as in the earlier embodiment. A P-body region 186 is diffused or otherwise applied to N- region 184, and in the P-body region is provided a shallow, highly-doped, positive ion P+ region 188; in addition, P+ regions 190 and 196 are provided. P+ regions 190 are disposed on both sides of P+ region 196 and extend under gate electrodes 194. A highly-doped negative ion N+ region 192 comprises the source. The P-body region 186 is provided to maintain high voltage capability. However additional P+ regions 188 and 190 are provided because they have a variable threshold voltage characteristic along the channel that they define. P+ regions 190, which were not included in the first embodiment of the channel diode device, have a maximum threshold voltage, $V_{TMAX}$, near the source, and a threshold voltage, $V_T$, elsewhere.

In the off state of configuration 180, the channel diode gate voltage, $V_{GS}$, is near $V_{TMAX}$, which is greater than $V_T$. As a result, most of the channel is inverted, except in the P+ regions and the channel length is effectively reduced, giving a higher ON-conductance. By applying a dynamic bias circuit to the configuration shown in FIG. 11, the gate voltage swing is reduced between the static and dynamic conductance states, while maintaining a higher ON-conductance.

Figure 12:
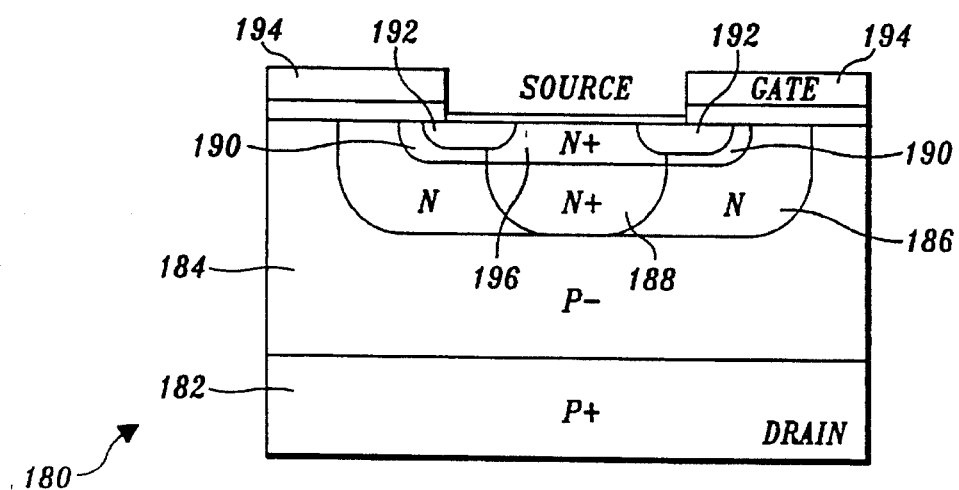
FIG. 12 is an elevational schematic cross-sectional diagram showing the configuration of an N-body channel diode otherwise like that of FIG. 11.

FIG. 12 shows a corresponding configuration for an N-body channel diode wherein each of the regions in the channel diode structure are opposite in polarity to the regions shown in FIG. 11 for the P-body channel diode. For the configuration of FIG. 12, the drain corresponds to the anode and the drain corresponds to the cathode.

The configurations shown in FIGS. 11 and 12 can also be applied to produce a synchronous rectifier MOSFET (not requiring a bias circuit) that has advantages over a conventional device of this type. The addition of the P+ (or N+) region shown in these figures within the P- (or N-) well in a synchronous MOSFET creates a variable threshold voltage along the channel of the device. The threshold voltage at the P+ (or N+) channel is $V_{TMAX}$ and the threshold elsewhere is $V_T$. In a conventional synchronous rectifier MOSFET, the threshold voltage must be made relatively high to avoid any false turn-on problems. However, in a synchronous rectifier MOSFET provided with the additional P+ (or N+) regions as shown in FIGS. 11 and 12, the value of $V_{TMAX}$ can be made very small, reducing the overall gate threshold turn-on voltage required. As a result, the modified synchronous rectifier MOSFET is much more efficient than the corresponding conventional device.

Figure 14:
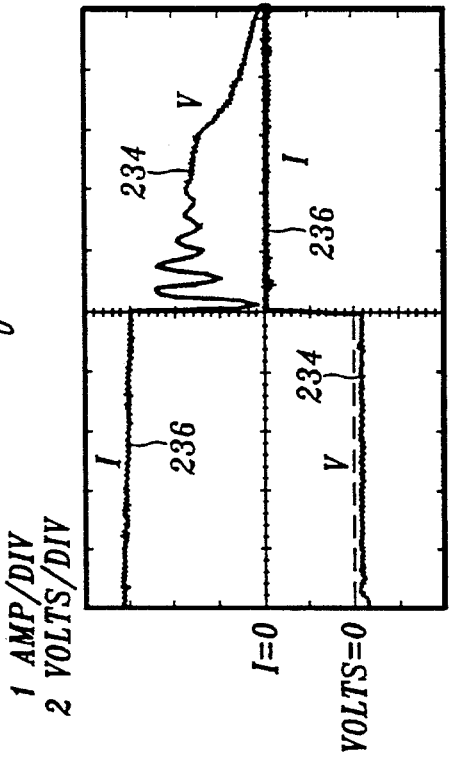
FIG. 14 is a graph of the current and voltage characteristics of the embodiments of the channel diode, comparing their gate voltage characteristics.
Figure 13:
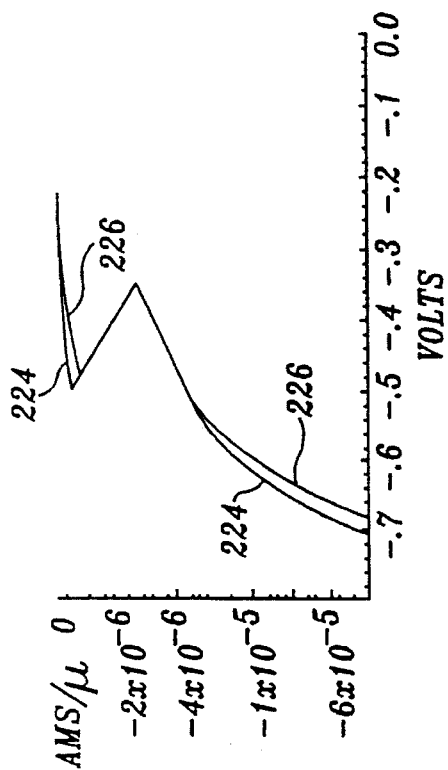
FIG. 13 is a graph comparing the conductance of the embodiment shown in FIGS. 11 and 12 with that of the embodiment of the linked-cell channel diode shown in FIG. 5.

FIG. 13 illustrates the improvement in conductance for the majority charge carrier configuration of FIGS. 11 and 12, compared to that of the first embodiment obtained by using a channel diode configuration based on the vertical structure shown in FIG. 1. In FIG. 13, a line 220 represents the current and voltage characteristic of the first configuration (like that of FIG. 1 ) and line 222 represents the current-voltage characteristics of the configuration shown in FIGS. 11 and 12. Approximately a 40% improvement in the ON-conductance is achieved with the improved configuration of FIGS. 11 and 12. Similarly, in FIG. 14, a line 224 represents the gate voltage swing required during a change from static to dynamic modes of operation for a vertical configuration like that of FIG. 1. A line 226 shows the gate voltage adjustment required for the configuration of FIGS. 11 and 12. For line 224, the gate voltage must be adjusted by 8.2 volts, whereas only 5.2 volts were required for line 226.

Figure 16:
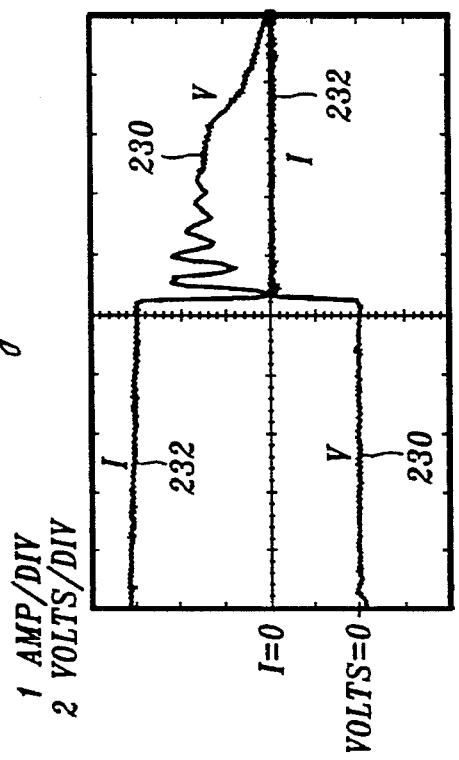
FIG. 16 is a graph of the current and voltage waveforms for a conventional (prior art) Schottky diode.
Figure 15:
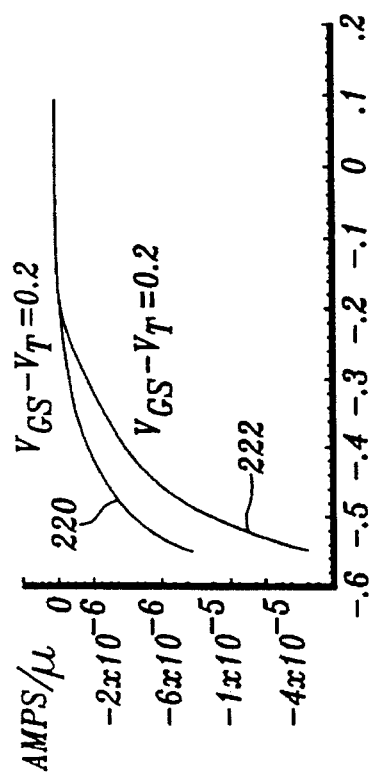
FIG. 15 is a graph of the current and voltage waveforms of the embodiment of the channel diode shown in FIGS. 11 and 12.

In FIGS. 15 and 16, a comparison of the channel diode turn-off wave forms using the improved configuration of FIGS. 11 and 12 and the turn-off wave forms of a Schottky diode are respectively illustrated. The forward voltage drop of the improved configuration shown in FIG. 15 is approximately 0 volts, while that of the Schottky diode shown in FIG. 16 is approximately 0.4 volts. Accordingly, it will be apparent that the improved ON-conductance is achieved with a commensurate improvement in forward voltage drop compared to a prior art Schottky diode.

Figure 17:
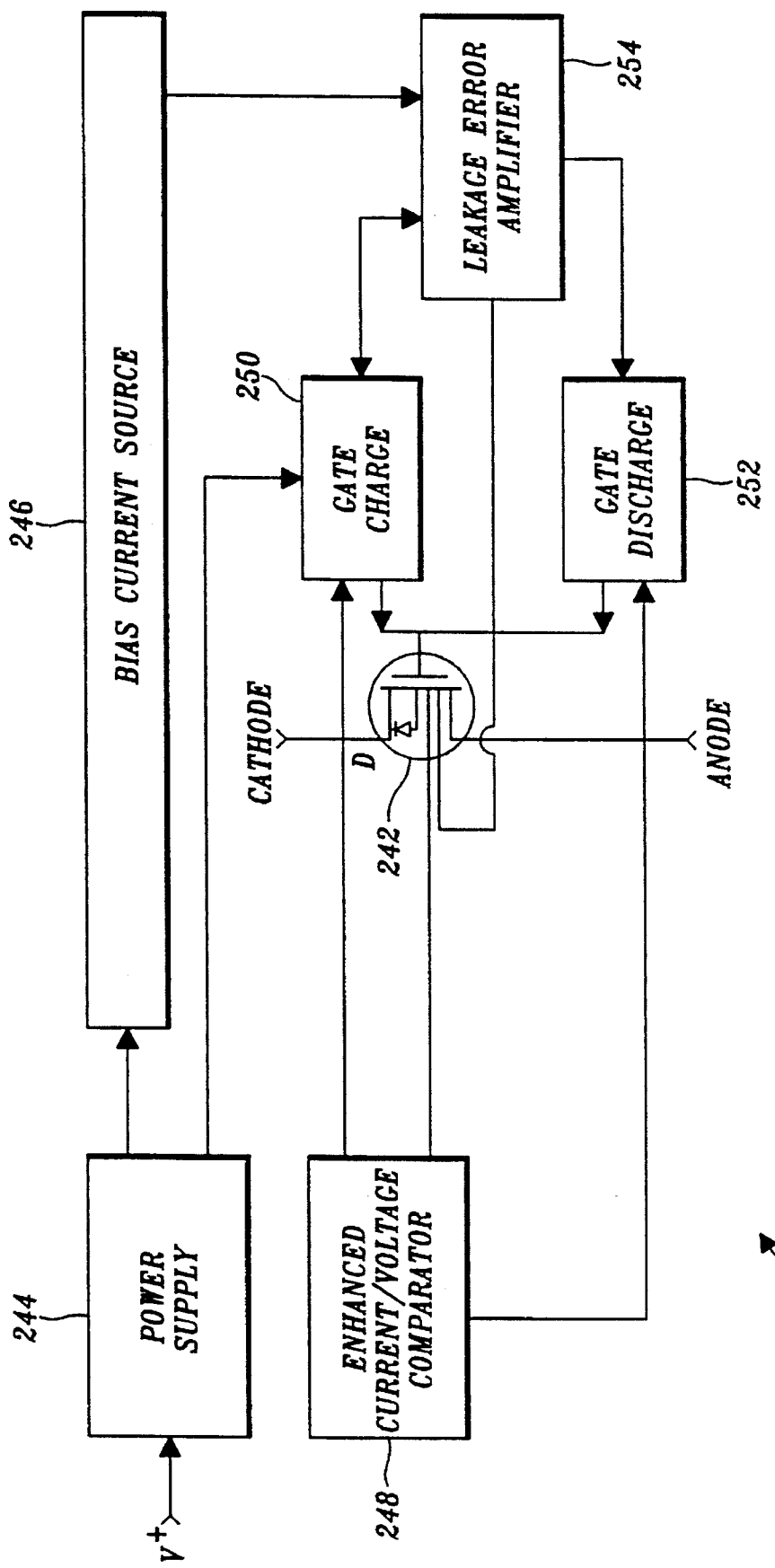
FIG. 17 is a schematic block diagram of a further embodiment of a dynamic bias circuit for use in controlling the operation of a channel diode.

In FIG. 17, yet another embodiment of a biasing circuit for use with a channel diode 242 is generally illustrated at reference numeral 240. Bias circuit 240 is a dynamic positive feedback bias circuit that monitors current flow through the channel diode without the use of a series resistor, thereby achieving dynamic control of the channel diode between its static and dynamic modes of conduction with relatively little forward voltage drop. As shown in the block diagram of FIG. 17, a power supply 244 is supplied with an external V+ input voltage to provide the operating potential for various components of the dynamic bias circuit. However, in an integral monolithic channel diode IC comprising bias circuit 240 and channel diode 242, the V+ input for power supply 244 is derived from the cathode connection to channel diode 242. Power supply 244 provides the appropriate voltage to a bias current source 246, which supplies bias current to both an enhanced current comparator block 248 and a leakage error amplifier block 254. The enhanced current comparator block monitors body diode current flow through channel diode 242, and provides an output signal to a gate charge block 250 to increase the gate potential of channel diode 242 when the current flowing through the channel diode exceeds a predefined value, e.g., 0.5 amps. If the current level drops below the predefined value, enhanced current comparator 248 provides a signal to a gate discharge block 252 that reduces the gate voltage on channel diode 242, switching it back into static mode.

In addition, leakage error amplifier 254 is connected to gate charge and gate discharge blocks 250 and 252, respectively, and also adjusts the gate threshold voltage-but only when channel diode 242 is operating in the static mode. Specifically, leakage error amplifier 254 compensates for variations in temperature, differences in the characteristics of channel diode 242 and its rated specifications, and other variables, by monitoring the cathode-anode leakage current to control the gate voltage applied by gate charge block 250 and reduced by gate discharge block 252. Accordingly, dynamic bias circuit 240 provides optimum control of channel diode 242, so that it operates with maximum conductance by switching between the static and dynamic modes of conduction, and minimizes the forward voltage drop required to control the gate voltage while compensating for variations in leakage current that would affect its operation and stability.

While the present invention has been disclosed with regard to several embodiments for the bias circuit and various configurations of the channel diode, it will be apparent to those of ordinary skill in the art that further modifications can be made to this invention within the scope of the claims that follow below. Accordingly, it is not intended that the scope of the claims in any way be limited by the disclosure of the preferred embodiments.

The embodiments of the invention in which an exclusive property or privilege is claimed are defined as follows:

1. A majority carrier semiconductor diode comprising:
   (a) an N-type region having a conductive contact, forming a drain;
   (b) a P-type material having a conductive contact, forming a body;
   (c) an N-type material applied to the P-type material forming the body and having a conductive contact, forming a source;
   (d) a dielectric material disposed adjacent the source and the drain and having a conductive contact that is not connected to the source or the drain, the conductive contact forming a gate; and
   (e) biasing means for biasing the gate to provide a conducting N-channel for electrical current flow between the source and the drain for a negative drain-source voltage, while blocking electrical current flow between the source and the drain for a positive drain-source voltage.

2. The majority carrier semiconductor diode of claim 1, wherein the biasing means provide a gate-source voltage that is less than a threshold voltage, creating a weak inversion layer in the body that does not support conduction unless the drain is more negative than the source.

3. The majority carrier semiconductor diode of claim 1, wherein the biasing means include negative feedback means for increasing a conductance of the N-channel.

4. The majority carrier semiconductor diode of claim 1, wherein the biasing means include positive feedback means for increasing a conductance of the N-channel.

5. The majority carrier semiconductor diode of claim 4, wherein the positive feedback means include means for biasing the gate-source voltage above the magnitude of a threshold voltage when the drain is more negative than the source and biasing the gate-source voltage to a substantially lower voltage if the drain is more positive than the source.

6. The majority carrier semiconductor diode of claim 1, wherein the P-type material comprising the body includes a P+ region on which the N-type material comprising the source is applied, said P+ region enabling a variable threshold for conductance through the N-type channel ranging between $V_T$ and $V_{TMAX}$ and reducing a length of the N-type channel, so that for a negative drain-source voltage:
   (a) conductance through the N-type channel is initiated with a gate-source voltage less than the threshold voltage $V_T$; and
   (b) once said conductance initiated, if the gate-source voltage is increased above the threshold voltage $V_T$, substantially increased conductance through the N-type channel occurs.

7. The majority carrier semiconductor diode of claim 6, wherein the P+ region underlies at least a portion of the gate and is substantially less than 1.0 μm thick.

8. A majority carrier semiconductor diode comprising:
   (a) a P-type region having a conductive contact, forming a drain;
   (b) an N-type material having a conductive contact, forming a body;
   (c) a P-type material applied to the N-type material forming the body and having a conductive contact, forming a source;
   (d) a dielectric material disposed adjacent the source and the drain and having a conductive contact that is not connected to the source or the drain, the conductive contact forming a gate; and
   (e) biasing means for biasing the gate to provide a conducting P-channel for electrical current flow between the source and the drain for a positive drain-source voltage, while blocking electrical current flow between the drain and the source if the drain-source voltage is negative.

9. The majority carrier semiconductor diode of claim 8, wherein the biasing means provide a gate-source voltage that is less than a threshold voltage, creating a weak inversion layer in the body that does not support conduction unless the drain is more positive than the source.

10. The majority carrier semiconductor diode of claim 8, wherein the biasing means include negative feedback means for increasing a conductance of the P-channel.

11. The majority carrier semiconductor diode of claim 8, wherein the biasing means include positive feedback means for increasing a conductance of the P-channel.

12. The majority carrier semiconductor diode of claim 11, wherein the positive feedback means include means for biasing the gate-source voltage above the magnitude of a threshold voltage when the drain is more positive than the source and biasing the gate-source voltage to a substantially lower voltage if the drain is more negative than the source.

13. The majority carrier semiconductor diode of claim 8, wherein the N-type material comprising the body includes an N+ region on which the P-type material comprising the source is applied, said N+ region enabling a variable threshold for conductance through the P-type channel ranging between $V_T$ and $V_{T\,MAX}$ and reducing a length of the P-type channel, so that for a positive drain-source voltage:

(a) conductance of the N-type channel is initiated with a gate-source voltage having a magnitude less than the threshold voltage $V_T$; and then, (b) if the magnitude of the gate-source voltage is increased above that of the threshold voltage $V_T$, substantially increased conductance through the P-type channel occurs.

14. The majority carrier semiconductor diode of claim 6, wherein the N+ region underlies at least a portion of the gate and is substantially less than 1.0 µm thick.

15. A biasing circuit for operating a metal oxide field effect transistor (MOSFET) as a diode that conducts electrical current between a drain and a source of the MOSFET in a forward direction, but not in a reverse direction, said biasing circuit comprising:

(a) conductance monitoring means for sensing one of:
  (i) an electrical current flowing through a drain and a source of a MOSFET, or
  (ii) a voltage across the drain and source of the MOSFET, said conductance monitoring means producing a feedback signal indicative of said one of the electrical current and the voltage; and (b) biasing means, coupled to the conductance monitoring means to receive the feedback signal, for providing a bias voltage in response to the feedback signal, said bias voltage being supplied to a gate of the MOSFET, said biasing means controlling the bias voltage so that the bias voltage is less than a threshold voltage necessary to bias the MOSFET into conductance in the reverse direction, but sufficient to minimize conductance through a body diode portion of the MOSFET in the forward direction.

16. The biasing circuit of claim 15, wherein the monitoring means comprise:

(a) a voltage comparator having inverting and non-inverting inputs and an output;

(b) an input resistor coupling one of the source and the drain of the MOSFET to one of inverting and non-inverting inputs of the voltage comparator, the other of the source and the drain being coupled to the other of the inverting and non-inverting inputs; and (c) a feedback resistor coupled between the output and one of the inverting and non-inverting inputs of the voltage comparator.

17. The biasing circuit of claim 15, further comprising:

(a) a diode having two terminals, one terminal being coupled to one of the drain and the source; and (b) a resistor having one end coupled to one of the inverting and non-inverting inputs and to one of the source and the drain of the MOSFET, and another end coupled to the input resistor and to another terminal of the diode, current flow through said diode corresponding to current flow through an internal body diode of the MOSFET and a voltage drop across the resistor being indicative of current flow through the internal body diode.

18. The biasing circuit of claim 15, wherein the conductance monitoring means comprise:

(a) a voltage comparator having inverting and non-inverting inputs and an output;

(b) a diode having two terminals; and (c) a resistor having two ends, one end being coupled to one of the source and the drain of the MOSFET and to one of the inverting and non-inverting inputs of the voltage comparator, and the other end of the resistor being coupled to one terminal of the diode and to the other of the inverting and non-inverting inputs of the voltage comparator, the other terminal of the diode being coupled to the other of the source and the drain of the MOSFET, current flow through said diode corresponding to current flow through an internal body diode of the MOSFET and a voltage drop across the resistor being indicative of current flow through the internal body diode.

19. The biasing circuit of claim 15, wherein the biasing means comprise a push-pull circuit connected to a voltage source and to one of the drain and source of the MOSFET.

20. A biasing circuit for biasing a majority charge carrier device to conduct an electrical current in a forward direction and block a flow of electrical current in a reverse direction through the device, the majority charge carrier device having a body, a gate, a source, and a drain, said bias comprising:

means for sensing a voltage between a source and a drain of a majority charge carrier device and producing a feedback signal in response to the voltage; and means for producing a control signal in response to the feedback voltage, said control signal being coupled to a gate of the majority charge carrier device, said means setting a magnitude of the control signal so that it is less than a threshold signal that would enable conduction between the source and the drain in a reverse direction, but so that it causes a conductance between the source and the drain in a channel formed within a body of the majority charge carrier device.

21. The biasing circuit of claim 20, wherein the means for producing the control signal increases its magnitude to exceed the threshold voltage once conductance in the channel of the majority charge carrier device has been initiated, thereby increasing the conductance of the electrical current flowing between the source and the drain.

22. A biasing circuit for biasing a majority charge carrier device to conduct an electrical current in a forward direction and block a flow of electrical current in a reverse direction through the device, the majority charge carrier device having a body, a gate, a source, and a drain, said biasing circuit comprising:

leakage current monitoring means, coupled to a source and a gate of a majority charge carrier device, for monitoring a leakage current through the majority charge carrier device and controlling a voltage applied to the gate of said device as a function of variations in the leakage current through said device, said static conduction mode enabling current to flow in a forward direction between the source and a drain of said device while the voltage applied to the gate is less than a threshold voltage that would cause conduction of electrical current between the source and the drain in a reverse direction; and current comparator means, coupled to the majority charge carrier device to sense electrical current flow between a body and the drain of the majority charge carrier device, and in response to the electrical current, controlling a gate voltage applied to the gate of the majority charge carrier device to control conduction between the source and the drain of said device, said current comparator means applying a voltage greater than the threshold voltage to the gate to initiate conduction in a dynamic mode after conduction of the electrical current between the source and the drain in a forward direction has already been initiated in the static mode and the electrical current flow has exceeded a predefined level, conductance of the device in the dynamic mode being much greater than in the static mode.

23. The biasing circuit of claim 22, wherein the current comparator means have substantially a zero forward voltage drop.

24. A method for operating a MOSFET as a diode, comprising the steps of:
   (a) monitoring one of:
      (i) an electrical current flowing through a drain and a source of a MOSFET, producing a feedback signal indicative of said electrical current; and
      (ii) a voltage across the drain and source of the MOSFET, producing a feedback signal indicative of said one of the electrical current and the voltage;
   (b) providing a bias voltage to a gate of the MOSFET in response to the feedback signal; and
   (c) controlling the bias voltage so that it is less than a first threshold voltage necessary to bias the MOSFET into conductance in the reverse direction, but substantially greater than a second threshold that enables conductance in the forward direction through a body diode portion of the MOSFET.

25. A method for operating a majority charge carrier device to conduct an electrical current in a forward direction and block the flow of electrical current in a reverse direction through the device, comprising the steps of:
   (a) sensing one of a voltage between a source and a drain of a majority charge carrier device, and a current flow through the majority charge carrier device, producing a feedback signal; and
   (b) producing a control signal in response to the feedback voltage, said control signal being coupled to a gate of the majority charge carrier device, said control signal being lower in magnitude than a threshold voltage, $V_T$, that would enable conduction between the source and drain in a reverse direction, but sufficient to cause a conductance in a forward direction between the source and the drain within a channel produced in the majority charge carrier device.

26. The method of claim 25, further comprising the step of increasing the control signal to exceed the threshold voltage once the conductance in the forward direction between the source and the drain of the majority charge carrier has been initiated, thereby increasing the conductance of the majority charge carrier device.

27. The method of claim 25, wherein the step of sensing includes the step of producing a negative feedback signal.

28. The method of claim 25, wherein the step of sensing includes the step of producing a positive feedback signal.

29. The method of claim 25, wherein the majority charge carrier device comprises an N-type region having a conductive contact, forming the drain; a P-type material applied to the N-type region and having a conductive contact, forming the body; and
   an N-type material applied to the P-type material that forms the body, and having a conductive contact, forming a gate, further comprising the step of creating a weak N-inversion layer channel in the body of the majority charge carrier device that does not support conduction unless the drain is more negative than the source.

30. The method of claim 29, wherein the step of producing the control signal comprises the steps of biasing a gate-source voltage above a predefined magnitude when the drain is more negative than the source and biasing the gate-source voltage to a substantially lower magnitude if the drain is more positive than the source.

31. The method of claim 25, wherein the majority charge carrier device comprises a P-type region having a conductive contact, forming the drain; an N-type material applied to the P-type region and having a conductive contact, forming the body; and a P-type material applied to the N-type material that forms the body, and having a conductive contact, forming a gate, further comprising the step of creating a weak P-inversion layer channel in the body of the majority charge carrier device that does not support conduction unless the drain is more positive than the source.

32. The method of claim 31, wherein the step of producing the control signal comprises the steps of biasing a gate-source voltage above a predefined magnitude when the drain is more positive than the source and biasing the gate-source voltage to a substantially lower magnitude if the drain is more negative than the source.

33. The method of claim 25, further comprising the step of providing a charge carrier region in the majority charge carrier device underlying at least a portion of the gate, said charge carrier region providing a variable threshold voltage along the channel ranging between $V_T$ and a greater magnitude voltage, $V_{TMAX}$, and shortening a length of the channel to produce a higher conductance through the channel.

34. The method of claim 22, wherein the variable threshold voltage is $V_{TMAX}$ adjacent the source and $V_T$ elsewhere, so that when the channel is not conducting, a gate-source voltage is substantially equal to $V_{TMAX}$, inverting most of the channel, except in a portion of the charge carrier region adjacent the gate.

35. A majority carrier semiconductor diode comprising:
   (a) an N-type region having a conductive contact, forming a drain;
   (b) a P-type material having a conductive contact, forming a body;
   (c) an N-type material applied to the P-type material forming the body and having a conductive contact, forming a source;
   (d) a dielectric material disposed adjacent the source and the drain and having a conductive contact, forming a gate; and
   (e) biasing means for biasing the gate to provide a conducting N-channel for electrical current flow between the source and the drain for a negative drain-source voltage, while blocking electrical current flow between the source and the drain for a positive drain-source voltage, the biasing means including feedback means for increasing a conductance of the N-channel.

36. The majority carrier semiconductor of claim 35, wherein the feedback means for increasing a conductance of the N-channel is negative.

37. The majority carrier semiconductor of claim 35, wherein the feedback means for increasing a conductance of the N-channel is positive.

38. A majority carrier semiconductor diode comprising:
   (a) a P-type region having a conductive contact, forming a drain;
   (b) an N-type material having a conductive contact, forming a body;
   (c) a P-type material applied to the N-type material forming the body and having a conductive contact, forming a source;
   (d) a dielectric material disposed adjacent the source and the drain and having a conductive contact, forming a gate; and (e) biasing means for biasing the gate to provide a conducting P-channel for electrical current flow between the source and the drain for a positive drain-source voltage, while blocking electrical current flow between the drain and the source if the drain-source voltage is negative, the biasing means including feedback means for increasing a conductance of the P-channel.

39. The majority carrier semiconductor of claim 38, wherein the feedback means for increasing a conductance of the P-channel is negative.

40. The majority carrier semiconductor of claim 38, wherein the feedback means for increasing a conductance of the P-channel is positive.

* * * * *